US008653626B2

(12) United States Patent
Lo et al.

(10) Patent No.: US 8,653,626 B2
(45) Date of Patent: Feb. 18, 2014

(54) PACKAGE STRUCTURES INCLUDING A CAPACITOR AND METHODS OF FORMING THE SAME

(75) Inventors: Sut-I Lo, Hsin-Chu (TW); Ching-Wen Hsiao, Hsin-Chu (TW); Hsu-Hsien Chen, Hsin-Chu (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/551,676

(22) Filed: Jul. 18, 2012

(65) Prior Publication Data

US 2014/0021583 A1    Jan. 23, 2014

(51) Int. Cl.
*H01L 23/34* (2006.01)
*H01L 23/48* (2006.01)
*H01L 23/52* (2006.01)
*H01L 29/40* (2006.01)
*H01L 21/00* (2006.01)

(52) U.S. Cl.
USPC .... 257/532; 257/713; 257/784; 257/E23.092; 438/122; 438/125

(58) Field of Classification Search
USPC .................. 257/532, 738, E23.021
See application file for complete search history.

(56) References Cited

U.S. PATENT DOCUMENTS

| 6,440,770 | B1 | 8/2002 | Banerjee et al. | |
|---|---|---|---|---|
| 7,230,317 | B2 | 6/2007 | Pearson et al. | |
| 2006/0054994 | A1* | 3/2006 | Harris et al. | 257/532 |
| 2009/0039986 | A1 | 2/2009 | Kamgaing et al. | |
| 2010/0230806 | A1* | 9/2010 | Huang et al. | 257/723 |
| 2011/0140272 | A1* | 6/2011 | Zhao et al. | 257/738 |
| 2011/0241168 | A1 | 10/2011 | Kim et al. | |

* cited by examiner

*Primary Examiner* — Ha Tran T Nguyen
*Assistant Examiner* — Thai T Vuong
(74) *Attorney, Agent, or Firm* — Slater & Matsil, L.L.P.

(57) ABSTRACT

A package includes a die, an encapsulant, and a capacitor. The package has a package first side and a package second side. The die has a die first side corresponding to the package first side, and has a die second side corresponding to the package second side. The die first side is opposite the die second side. The encapsulant surrounds the die. The capacitor includes a first plate and a second plate in the encapsulant, and opposing surfaces of the first plate and the second plate extend in a direction from the package first side to the package second side. The external conductive connectors are attached to at least one of the package first side and the package second side.

19 Claims, 9 Drawing Sheets

PACKAGE STRUCTURES INCLUDING A CAPACITOR AND METHODS OF FORMING THE SAME

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Package on package (PoP) technology is becoming increasingly popular for its ability to allow for denser integration of integrated circuits into a small overall package. PoP technology is employed in many advanced handheld devices, such as smart phones, for example. Other packaging techniques also provide improved integration density using various features.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1:
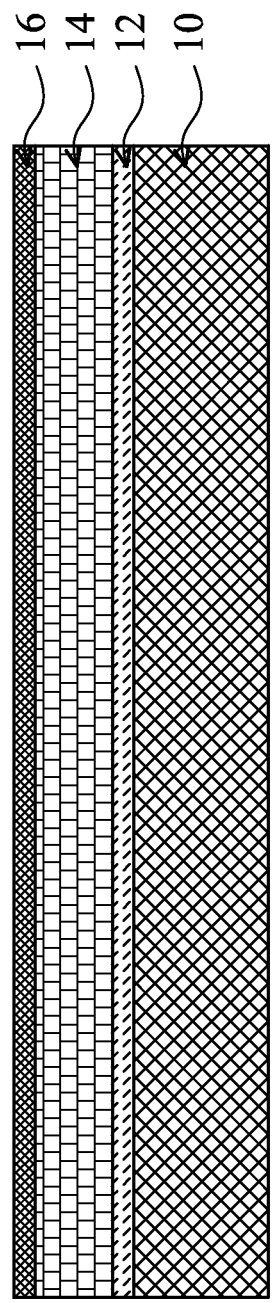
FIGS. 1 through 8 are a method of forming a package comprising a vertical capacitor according to an embodiment.

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

One or more embodiments contemplate, for example, a capacitor, such as a metal-insulator-metal (MIM) capacitor, formed in an integrated circuit package, such as used in Package-on-Package (PoP) configurations. Various embodiments contemplate applications in various packaging environments and packages. Persons having ordinary skill in the art will readily understand modifications that can be made to an example package and method described herein to achieve other packages and methods that are contemplated within the scope of various embodiments. Like reference numerals in the figures refer to like components, and although described in a particular order, various method embodiments may be performed in other logical orders and with various modifications.

FIGS. 1 through 8 illustrate a method and various structures of a package comprising a capacitor formed in the package. FIG. 1 illustrates a first carrier substrate 10, a Light-to-Heat-Conversion (LTHC) release coating 12, a passivation film 14, and a seed layer 16. The first carrier substrate 10 provides temporary mechanical and structural support during subsequent processing steps. The first carrier substrate 10 may comprise, for example, glass, silicon oxide, aluminum oxide, a combination thereof, and/or the like and may be a wafer. The LTHC release coating 12 is formed over a surface of the first carrier substrate 10. The LTHC release coating 12 is, for example, an oxide, a nitride, an organic material, the like, or a combination thereof, such as silicon oxide, silicon nitride, or silicon oxynitride. The LTHC release coating 12 can be formed using a chemical vapor deposition (CVD), the like, or a combination thereof. The passivation film 14 is formed over a surface of the LTHC release coating 12. The passivation film 14 is, for example, polybenzoxazole (PBO), polyimide, benzocyclobutene (BCB), polynorbornene, poly-p-xylylene (PPX), the like, or a combination thereof, and can be deposited by a coating process, a lamination process, the like, or a combination thereof. The seed layer 16 is deposited over a surface of the passivation film 14. The seed layer 16 is, for example, copper, titanium, the like, or a combination thereof deposited by sputtering, another PVD process, or the like.

Figure 2:
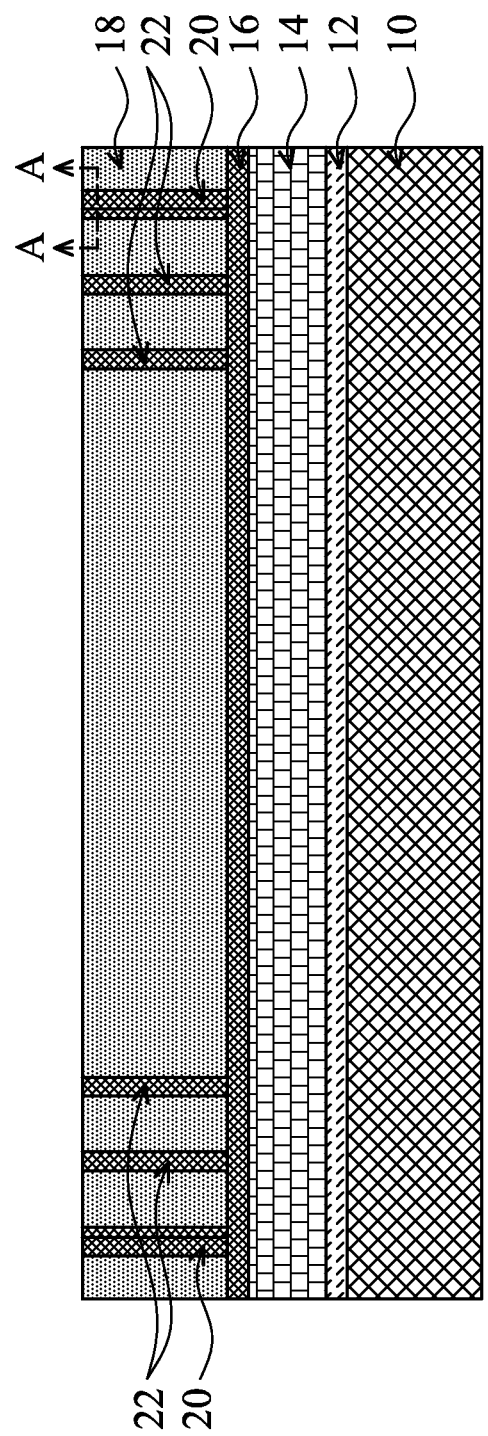

FIG. 2 further illustrates a photoresist 18, vertical capacitors 20, and through-vias 22. The photoresist 18 can be any acceptable material and can be deposited using acceptable deposition techniques, such as a spin-on process. The photoresist 18 is patterned to create openings for the vertical capacitors 20 and through-vias 22 using acceptable photolithography techniques. A conductive material, such as copper, aluminum, the like, or a combination thereof, is deposited in the openings by electroless plating, electroplating, or the like to form the vertical capacitors 20 and through-vias 22. The photoresist is removed, such as by an ash and/or flush process.

Figure 3:
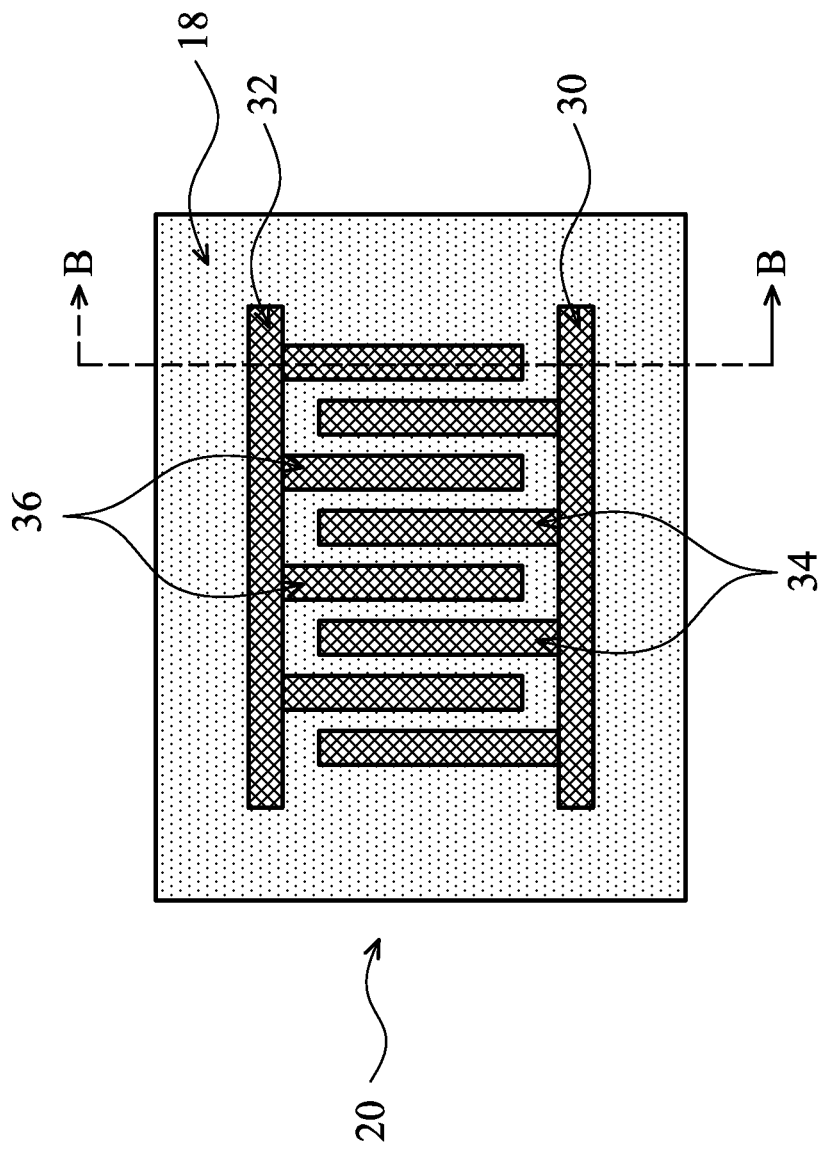

FIG. 3 is a layout view of a vertical capacitor 20 at the cross-section A-A identified in FIG. 2. The vertical capacitor 20 includes a first vertical plate 30 and a second vertical plate 32. The first vertical plate 30 opposes the second vertical plate 32. The first vertical plate 30 includes first fingers 34, and the second vertical plate 32 includes second fingers 36. The first fingers 34 are interdigitated with the second fingers 36. Surfaces of the first vertical plate 30 including the first fingers 34 and surfaces of the second vertical plate 32 including the second fingers 36 that oppose each other extend in parallel to each other and perpendicular to an underlying surface, for example, a top surface of the passivation film 14. As a person having ordinary skill in the art would readily understand, perpendicular or parallel surfaces in the context of the art include substantially perpendicular or parallel surfaces, respectively, resulting from, for example, process variations due to the materials used and/or processes performed on the materials.

As will become clear later, a dielectric material, such as an encapsulant like a molding compound; a gas such as air, oxygen, nitrogen, or the like; or a combination thereof, can be formed between the opposing surfaces of the first vertical plate 30 and the second vertical plate 32 to form the vertical capacitor 20. In the illustrated embodiment, the vertical capacitor 20 is a comb-structure, interdigitated vertical capacitor. Other embodiments contemplate various modifications to the vertical capacitor 20, such as more or less fingers or use of vertical plates without fingers. Various parameters, such as area of the plates, distances between the plates, and vertical heights of the plates can be tuned to achieve an appropriate capacitance of the vertical capacitor 20 for a particular application. Cross-section B-B illustrates the cross-sectional view depicted in FIG. 2.

Figure 4:
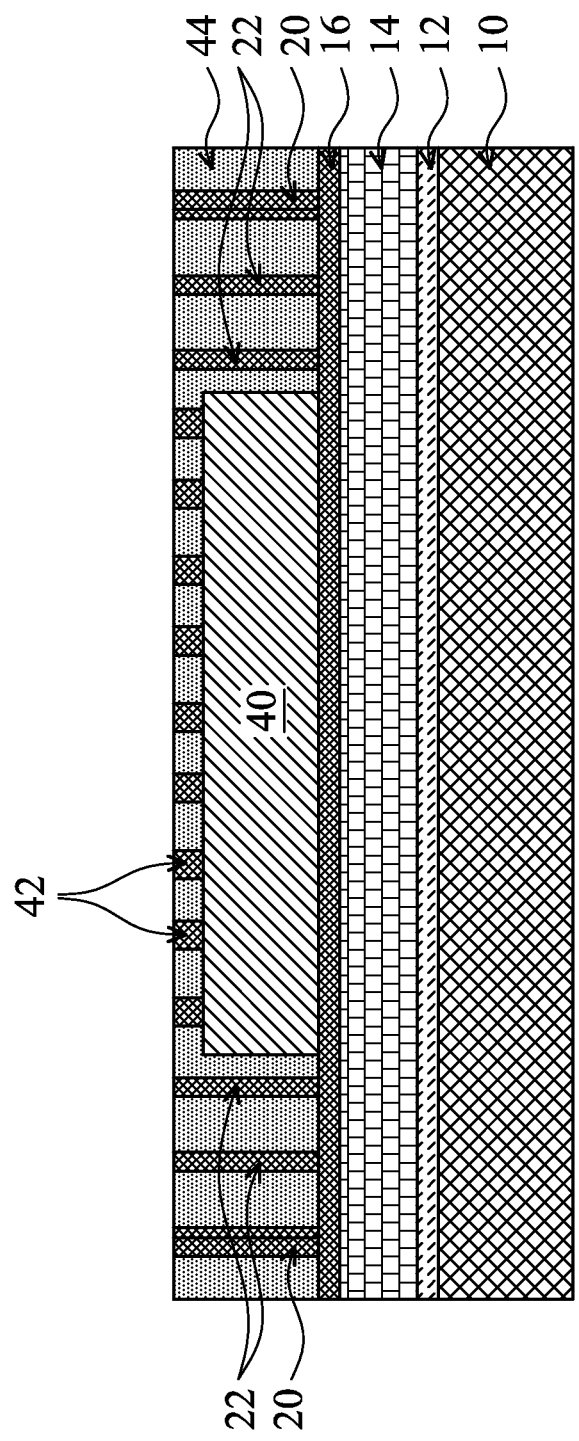

FIG. 4 illustrates a package further including an integrated circuit die 40 with external conductive connectors 42 and an encapsulant 44. The die 40 is processed according to acceptable semiconductor processing techniques and includes external conductive connectors 42 that provide a means for electrically coupling integrated circuits within the die 40 to a component external to the die 40. After removal of the photoresist 18, the die 40 is attached to the seed layer 16. The die 40 may be attached using, for example, a die attach film (DAF). As shown, the die 40 is attached centrally located to the structure disposed between through-vias 22 vertical capacitors 20, although the die 40 can be attached in other locations of the structure. An encapsulant 44 is then applied to the structure to encapsulate the die 40, through-vias 22, and vertical capacitors 20. The encapsulant 44 in this embodiment is a molding compound applied using compression molding. Other embodiments contemplate other materials applied by other acceptable techniques. The encapsulant 44 is grinded and/or polished, such as by a chemical mechanical polish (CMP), to expose the vertical capacitors 20, through-vias 22, and connectors 42 through a surface of the encapsulant 44. For convenience and ease of description, the terms "front side" and "backside" may be used in the remainder of the description to easily reference respective opposing sides of the package. As depicted in FIG. 4, the front side of the package corresponds to the exposed upper surface, and the backside of the package is the side bonded to the first carrier substrate 10. In this illustrated embodiment, a front side of the die 40 is an active side of the die 40 and corresponds to the front side of the package.

A person having ordinary skill in the art will understand that the encapsulant 44 may generally be a dielectric material between the opposing plates of the vertical capacitor 20 that is typically used to determine, at least in part, the capacitance value of the vertical capacitor 20. The relative permittivity of the encapsulant 44 is generally used in calculating the capacitance value. In some embodiments, the encapsulant 44 wholly fills the spaces between the opposing plates of the vertical capacitor 20. In other embodiments, the encapsulant 44 may not wholly fill the spaces, but voids may be formed in some spaces. These voids may comprise air, oxygen, nitrogen, or another external gas present when applying the encapsulant 44. Whether voids are present and what gas the voids comprise can affect the relative permittivity of the material(s) between the opposing plates, and thus, can affect the capacitance value of the vertical capacitor 20.

Figure 5:
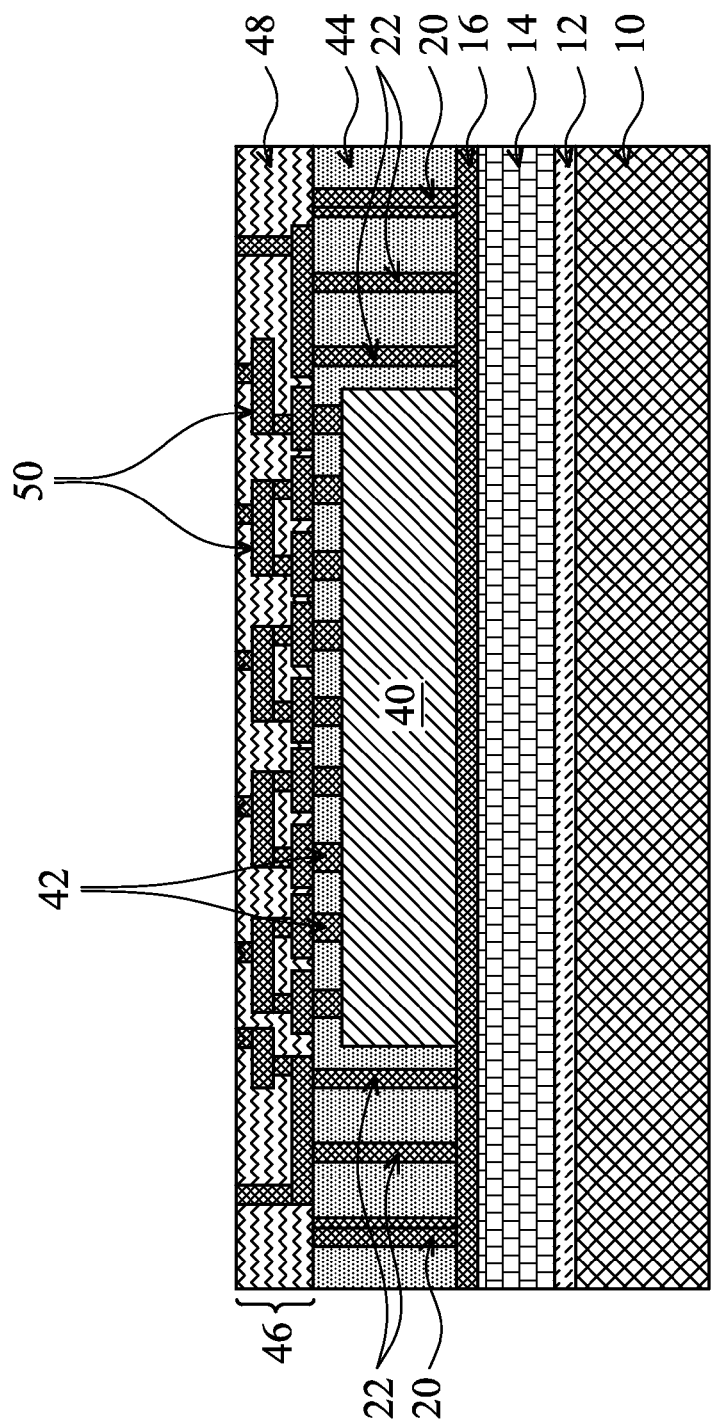

FIG. 5 depicts the package further including a front side redistribution layer (RDL) 46 that comprises one or more dielectric layer 48 and interconnect structures 50. Methods and appropriate materials used for forming the front side RDL 46 will be readily apparent to a person having ordinary skill in the art such that a brief overview will be explicitly described herein. A seed layer, such as a copper, titanium, or the like, is deposited on the encapsulant 44, through-vias 22, vertical capacitors 20, and connectors 42, such as by sputtering or another physical vapor deposition (PVD) process. A photo resist is deposited on the seed layer and patterned to expose portions of the seed layer by photolithography. The pattern is for a first metallization layer of the front side RDL 46. Conductive material of the first metallization layer, such as copper, aluminum, the like, or a combination thereof, is deposited on the exposed seed layer, such as by electroless plating, electroplating, or the like. The photoresist is removed by an ash and/or flush process. The exposed seed layer is removed, such as by a wet or dry etch. A first dielectric layer is deposited over the first metallization layer. The first dielectric layer may be a polyimide, polybenzoxazole (PBO), benzocyclobutene (BCB), the like, or a combination thereof, deposited by a coating process, a lamination process, the like, or a combination thereof. Openings may be formed through the first dielectric layer to the first metallization layer using acceptable photolithography techniques. Subsequent metallization layers and dielectric layers may be formed using the same or similar processes as discussed with regard to the first metallization layer and the first dielectric layer. Conductive material deposited during the formation of a subsequent metallization layer may be deposited in openings of the previously formed dielectric layer formed using acceptable photolithography techniques to electrically couple respective metallization layers. The patterns of the various metallization layers form the interconnect structures 50 in the dielectric layers 48. Embodiments can be formed using other acceptable processes. Embodiments may have any appropriate number of metallization layers or dielectric layers.

Figure 6:
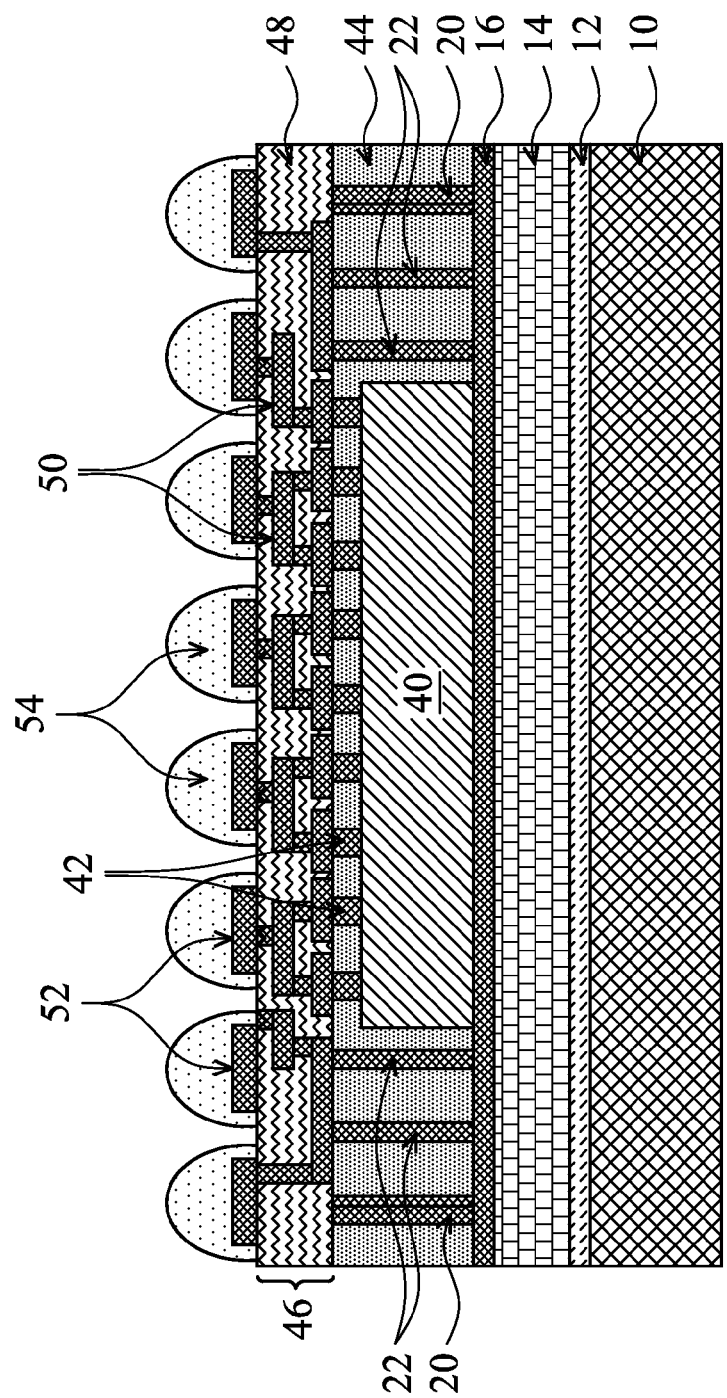

FIG. 6 illustrates the package further comprising bond pads 52 and conductive connectors 54 formed on the front side. The bond pads 52 are formed over the topmost dielectric layer of the front side RDL 46 and/or in openings of the topmost dielectric layer. The bond pads 52 can comprise aluminum, titanium, the like, or a combination thereof in a single or multi-layered structure and can be formed using acceptable plating and/or lithography processes. The conductive connectors 54 can comprise lead-free solder and can be controlled collapse chip connection (C4) bumps, although other embodiments contemplate other conductive connectors, such as comprising bumps, pillars, columns, or the like.

Figure 7:
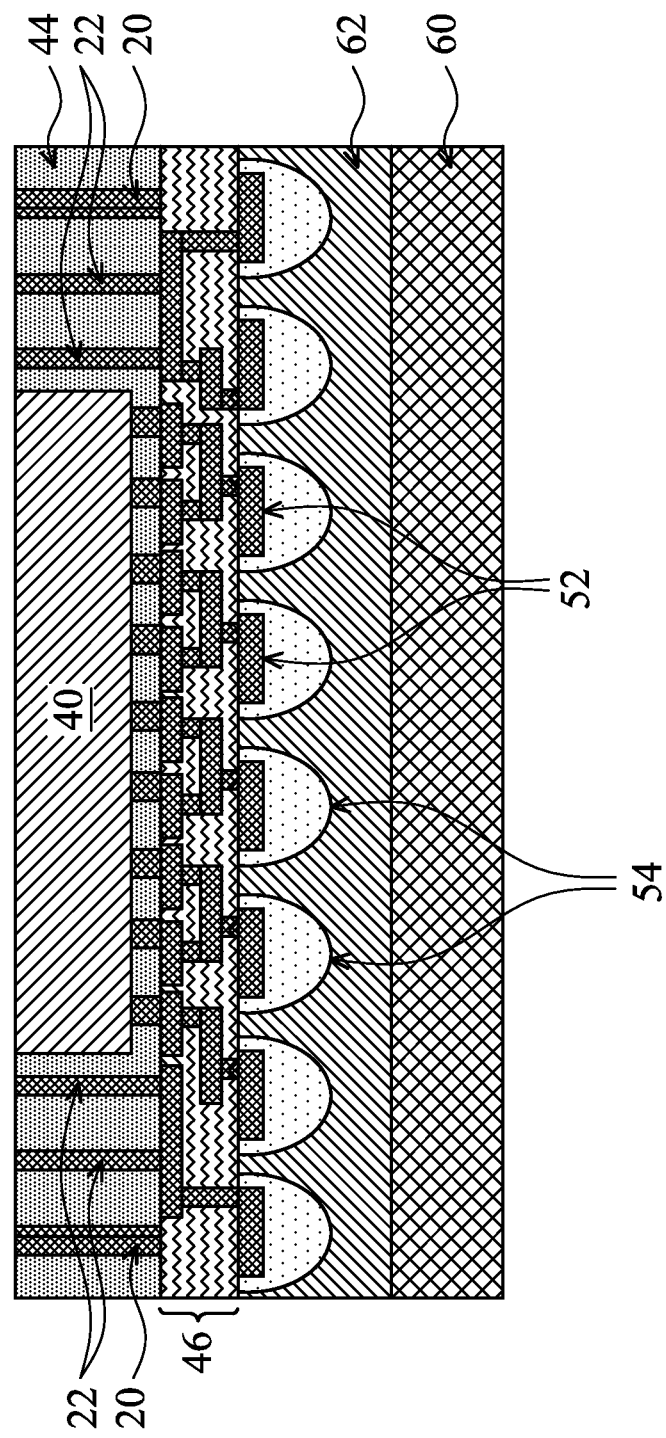

FIG. 7 illustrates the package prepared for backside processing. The package of FIG. 6 is flipped, and the front side of the package is adhered to a second carrier substrate 60. using an adhesive 62, such as ultraviolet (UV) glue that can be detached by exposure to UV light. The second carrier substrate 60 may comprise, for example, glass, silicon oxide, aluminum oxide, a combination thereof, and/or the like. The first carrier substrate 10 is de-bonded from the backside of the package, and any remaining LTHC release coating 12, passivation film 14, and seed layer 16 is removed using, for example, grinding, polishing, and/or etching.

Figure 8:
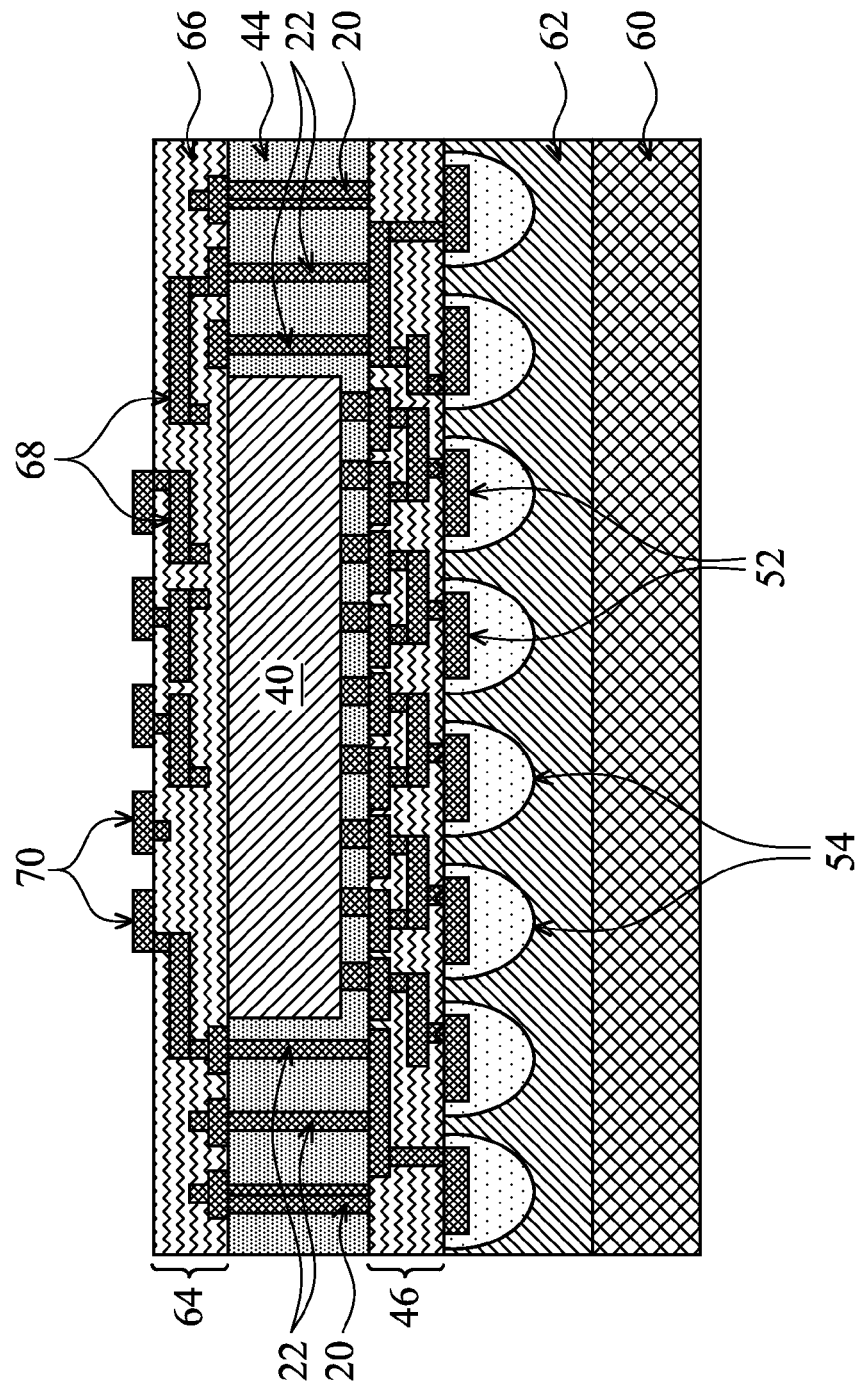

FIG. 8 illustrates the package further comprising a backside RDL 64. The backside RDL 64 comprises one or more dielectric layer 66 and interconnect structures 68. The backside RDL 64 is formed using similar or the same processes as described above with respect to the front side RDL 46. Bond pads 70 are formed on the back side RDL 64 using the same or similar processes as discussed with respect to the bond pads 52. Accordingly, explicit discussion of the materials and methods of forming these components is omitted for brevity.

Figure 9:
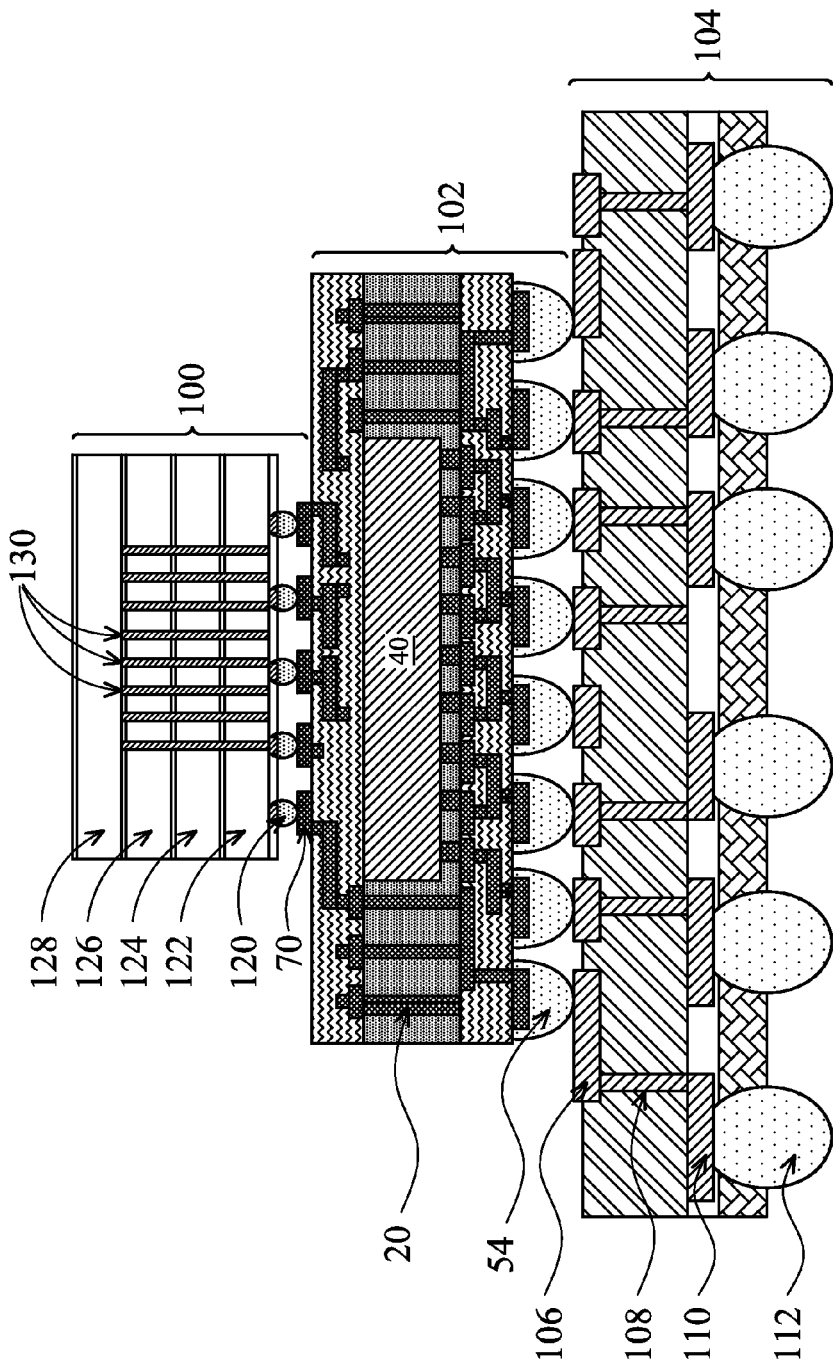
FIG. 9 is a package comprising a vertical capacitor according to an embodiment.

FIG. 9 illustrates a package according to an embodiment. The package includes an additional component 100, a package 102 as formed in FIGS. 1 through 8, and an organic substrate 104. The package 102 illustrated in FIG. 8 is detached from the second carrier substrate 60, such as by exposing the adhesive 62 to UV light when the adhesive comprises a UV glue. The front side of the package 102 is then attached to the organic substrate 104 by reflowing the conductive connectors 54 onto pads 106 on the organic substrate 104. The organic substrate 104 comprises, for example, pads 106 electrically coupled to through-vias 108 through the substrate that are further electrically coupled to pads 110 on an opposing side of the organic substrate 104. Conductive connectors 112, such as ball grid array (BGA) balls, are on the pads 110.

The additional component 100 depicted in FIG. 9 is a three-dimensional integrated circuit (3DIC) comprising dies 122, 124, 126, and 128. The dies 122, 124, 126, and 128 are stacked, for example, by bonding with or without an adhesive. Lower ones of the dies 122, 124, 126, and 128 include through-vias 130 to electrically couple the dies 122, 124, 126, and 128. Methods for forming a 3DIC are well known, and are omitted herein. The 3DIC is attached to the package 102 using conductive connectors 120, such as comprising microbumps, minibumps, pillars, columns, or the like, reflowed and connected to the bond pads 70 on the backside of the package 102. Other embodiments contemplate as the additional component 100 another package, e.g., similar to package 102, a two-and-a-half-dimensional IC (2.5DIC) comprising an interposer and one or more die, a 3DIC comprising any number of dies, a single die such as a flip chip, the like, or a combination thereof.

Vertical capacitors 20, as depicted, are directly coupled between interconnect structures in the two RDLs 46 and 64. How the vertical capacitors 20 are electrically coupled between the various devices and components can depend upon the desired application. For example, one or more capacitors can be coupled to one or more respective signal interconnects between the additional component 100 and the die 40, between the die 40 and the organic substrate 104, and/or between the additional component 100 and the organic substrate 104. The vertical capacitors can be high volume capacitors embedded within a package and out of a die, thus allowing design area within a die to be allocated for another use or removed. The vertical capacitors 20 can further reduce a delay in a signal, such as a rising and/or falling edge of the signal, by providing a more favorable RC value, which can in turn allow for increased operational frequency.

An embodiment is a structure comprising a package and external conductive connectors. The package comprises a die, an encapsulant, and a capacitor. The package has a package first side and a package second side. The die has a die first side corresponding to the package first side, and has a die second side corresponding to the package second side. The die first side is opposite the die second side. The encapsulant surrounds the die. The capacitor comprises a first plate and a second plate in the encapsulant, and opposing surfaces of the first plate and the second plate extend in a direction from the package first side to the package second side. The external conductive connectors are attached to at least one of the package first side and the package second side.

Another embodiment is a structure comprising a die, a molding compound, a vertical capacitor, a redistribution layer, and external conductive connectors. The molding compound encapsulates the die. The molding compound has a first surface and a second surface, and the first surface corresponds to an active side of the die. The vertical capacitor comprises at least two opposing plates in the molding compound, and opposing surfaces of the opposing plates extend perpendicular to the first surface and the second surface. The redistribution layer is on at least one of the first surface and the second surface. The external conductive connectors are attached to the first redistribution layer.

A further embodiment is a method comprising forming a first plate and a second plate of a vertical capacitor on a surface of a carrier substrate, opposing surfaces of the first plate and second plate extending perpendicular to the surface of the carrier substrate; attaching a die to the surface of the carrier substrate; encapsulating the die, the first plate, and the second plate with an encapsulant material, the encapsulant material having a first side distal from the carrier substrate; and forming external conductive connectors coupled to the first side.

Although the present embodiments and their advantages have been described in detail, it should be understood that various changes, substitutions and alterations can be made herein without departing from the spirit and scope of the disclosure as defined by the appended claims. Although many modifications are discussed above, other modifications can be made to the disclosed embodiments, such as inverting a facing direction of a die in the package and corresponding modifications in processing. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A structure comprising:
   a package having a package first side and a package second side, the package comprising:
      a die having a die first side corresponding to the package first side, and having a die second side corresponding to the package second side, the die first side being opposite the die second side;
      an encapsulant surrounding the die; and
      a capacitor comprising a first plate and a second plate in the encapsulant, opposing surfaces of the first plate and the second plate extending in a direction from the package first side to the package second side, a region between the opposing surfaces comprising a portion of the encapsulant, a gas, or a combination thereof; and
   external conductive connectors attached to at least one of the package first side and the package second side.

2. The structure of claim 1, wherein the encapsulant comprises a molding compound.

3. The structure of claim 1, wherein the region comprises the encapsulant.

4. The structure of claim 1, wherein the capacitor comprises first fingers attached to the first plate, and comprises second fingers attached to the second plate, the first fingers and the second fingers being interdigitated.

5. The structure of claim 1, wherein the package further comprises a redistribution layer on at least one of the die first side and the die second side, the external conductive connectors being attached to the redistribution layer.

6. The structure of claim 1, wherein the package further comprises a through-via extending in the direction from the package first side to the package second side.

7. The structure of claim 1 further comprising:
   an additional die coupled to the package second side of the package; and
   a substrate coupled to the package first side of the package, the external conductive connectors being attached to the substrate and the package first side.

8. A structure comprising:
a die;
a molding compound encapsulating the die, the molding compound having a first surface and a second surface, the first surface corresponding to an active side of the die;
a vertical capacitor comprising at least two opposing plates in the molding compound, opposing surfaces of the opposing plates extending perpendicular to the first surface and the second surface, a volume between the opposing surfaces comprising a portion of the molding compound, a gas, or a combination thereof;
a first redistribution layer on at least one of the first surface and the second surface; and
external conductive connectors attached to the first redistribution layer.

9. The structure of claim 8, wherein each of the opposing plates includes fingers, each of the opposing plates and respective fingers forming a comb structure, the fingers being interdigitated.

10. The structure of claim 8, wherein the volume comprises the molding compound.

11. The structure of claim 8 further comprising a through-via in the molding compound and extending from the first surface to the second surface.

12. The structure of claim 8 further comprising a second redistribution layer on one of the first surface and the second surface, the second redistribution layer being on the first surface or second surface different from the first redistribution layer.

13. The structure of claim 8 further comprising:
an additional component including an additional die, the additional component being coupled to one of the first surface and the second surface; and
an organic substrate coupled to one of the first surface and the second surface opposite the additional component, the external conductive connectors being attached to the organic substrate.

14. A structure comprising:
a molding compound surrounding a die, the molding compounding having a first side and a second side;
a capacitor in the molding compound, the capacitor comprising a first electrode and a second electrode, the first electrode comprising a first plate and first fingers attached to the first plate, the second electrode comprising a second plate and second fingers attached to the second plate, the first fingers and the second fingers being interdigitated, a space between the first fingers and the second fingers comprising the molding compound, a gas, or a combination thereof; and
a first redistribution layer on the first side or the second side.

15. The structure of claim 14 further comprising a through-via in the molding compound and extending from the first side to the second side.

16. The structure of claim 14, wherein the space comprises the molding compound.

17. The structure of claim 14, wherein a surface of the die is co-planar with a surface of the molding compound.

18. The structure of claim 14 further comprising a second redistribution layer on the first side or the second side opposite the first redistribution layer.

19. The structure of claim 14 further comprising:
an additional die coupled to the second side; and
a substrate coupled to the first side.

* * * * *